United States Patent [19]

Raith

[11] Patent Number: 5,230,077
[45] Date of Patent: Jul. 20, 1993

[54] METHOD OF REDUCING THE POWER REQUIREMENTS IN A MOBILE RADIO RECEIVER

[75] Inventor: Alex K. Raith, Kista, Sweden

[73] Assignee: Telefonaktiebolaget L M Ericsson, Stockholm, Sweden

[21] Appl. No.: 558,495

[22] Filed: Jul. 27, 1990

[30] Foreign Application Priority Data

Aug. 25, 1989 [SE] Sweden .................................. 8902844

[51] Int. Cl.⁵ ........................ H04B 15/00; H04B 1/16
[52] U.S. Cl. ..................................... 455/65; 455/67.6; 455/226.1; 455/296; 455/343
[58] Field of Search ................. 455/65, 63, 67, 343, 455/54, 56, 226, 296, 297; 375/11, 15, 99, 101, 102, 104, 67.1–67.7, 226.1–226.4, 54.1–54.2

[56] References Cited

U.S. PATENT DOCUMENTS

| | | | |
|---|---|---|---|
| 4,803,739 | 2/1989 | Daikoku et al. | 455/63 |
| 4,823,398 | 4/1989 | Hashimoto | 455/343 |
| 5,014,283 | 5/1991 | Baier | 375/15 |

FOREIGN PATENT DOCUMENTS 9011652 10/1990 World Int. Prop. O. .......... 455/343

Primary Examiner—Reinhard J. Eisenzopf
Assistant Examiner—Christine K. Belzer
Attorney, Agent, or Firm—Burns, Doane, Swecker & Mathis

[57] ABSTRACT

In a receiving circuit of a mobile telephone apparatus the incoming baseband signals are demodulated and equalized so as to compensate for deficiencies (multipath propagation) of the radio medium between base station and mobile telephone apparatus. It is not, however, always necessary to equalize the demodulated signals, for instance at low symbol rates or in the case of monopath propagation. According to the invention, time dispersion of the received signals is estimated prior to demodulation, and demodulation with equalization (3a) is effected when the time dispersion is established to be higher than a given value, whereas demodulation without equalization (3b) is effected when the time dispersion is lower than this value. This will enable the power consumed by the receiving circuit to be reduced, particularly in the listening mode of the apparatus.

4 Claims, 3 Drawing Sheets

METHOD OF REDUCING THE POWER REQUIREMENTS IN A MOBILE RADIO RECEIVER

TECHNICAL FIELD

The present invention relates to a method of reducing the power consumption of a mobile telephone when receiving signals from a base station, and also of reducing the complexity of the apparatus. More specifically, but not exclusively, the invention is intended to reduce the power requirement of the apparatus, by the activating, under given conditions, the equalizer normally incorporated in said apparatus.

BACKGROUND ART

The receiving circuit of a mobile telephone apparatus normally includes a so-called equalizer which is operative to compensate for irregularities or deficiencies in the radio medium when transmitting radio signals from a base station. An equalizer is primarily used in receiving circuits for the purpose of reducing bit errors that occur in the incoming radio signal as a result of multipath propagation in the radio medium. This is described, for instance, in WO 88/05981, which relates to a TDMA-system which includes so-called adaptive equalization. The setting of the equalizer incorporated in the radio receiver is contingent on synchronizing words that are sent simultaneously with the data words transmitted from the radio transmitter in time multiplex. With the aid of these synchronizing words, the equalizer can be set so as to equalize the dispersion properties of the medium upon receipt of the data words. Radio receivers which include equalizers are primarily used for high symbol rate (>100 kbit/s) the bit sensitivity of which due to multipath propagation is greater than the bit sensitivity of slower symbol rate.

DISCLOSURE OF THE INVENTION

The need for an equalizer is also determined by the nature of the surroundings, in addition to the symbol rate. The lowest multipath propagation effect is obtained, for instance, from a totally level landscape which is devoid of buildings. The following general points of view can be given: When the symbol rate exceed a given value (about 100 kbit/s) it is necessary to use an equalizer irrespective of the nature of the surroundings, in order for sensitivity to bit error to lie on a given, acceptable level.

It is also necessary to use an equalizer at low symbol rate (rate in the order of some tens of kbit/s) when the surrounding countryside is "difficult", i.e. when the countryside is hilly or is densely built-up with high-rise apartment buildings.

Thus, both of these cases leave no choice as to whether an equalizer should be included or not. The provision of an equalizer is a necessity, despite the fact that the symbol rate is relatively low.

The use of an equalizer will also depend on the demodulation method applied in the radio receiver. It is not possible to use an equalizer with non-coherent demodulation, since the equalizer requires information concerning the phase and amplitude of the received signal.

The advantage of an equalizer is that it is able to equalize time dispersion in the signals received, provided that coherent detection is applied. The disadvantage of the equalizer is that it is relatively complex and has a relatively high power consumption.

The absence of an equalizer affords the advantage of enabling noncoherent demodulation to be applied, which results in a lower degree of complexity in the receiver and a lower current consumption. In addition, a robust receiver is obtained with rapidly varying radio channels, due to high vehicle speeds. The disadvantage lies in the fact that the demodulation cannot be carried out with time dispersion, which constitute a considerable part of the symbol time.

Consequently, it is desirable to use in one and the same receiver, demodulation with the aid of an equalizer when appropriate with the aforegoing and demodulation with equalizer when this is appropriate.

The object of the invention is to provide a method and apparatus which fulfil the aforesaid desiderata.

According to the proposed method, the time dispersion over the radio channel used is estimated and a demodulator with or without equalizer is connected to the receiving path depending on the estimated time dispersion.

BRIEF DESCRIPTION OF THE DRAWINGS

The invention will now be described in more detail with reference to the accompanying drawings.

BEST MODE FOR CARRYING OUT THE INVENTION

The inventive method is intended for a digital mobile radio system having time division multiple access, so-called TDMA. A known digital TDMA-mobile radio system in which the invention can be applied includes a plurality of permanent base stations and a plurality of mobile radio stations capable of communicating with one another over given radio channels. The base stations are operative to transmit radio signals on a plurality of radio channels within, for instance, the frequency range of 935-960 MHz, whereas the mobile stations are able to transmit radio signals on a plurality of radio channels within, for instance, the frequency range 890-915 MHz. Transmission on the radio channels is divided into frames and time slots in accordance with FIG. 1, so that a frame will have a duration of about 8 ms and will include eight time slots, each with a duration of about 1 ms. Of the radio channels available, one or a small number of said channels is used for the purpose of transmitting general information to the mobile stations in a controlled and coordinated fashion. A synchronizing word SW is placed in the centre of the data message. This synchronizing word can also be used to estimate the time dispersion, so as to enable the adaptive equalizer to be set on the basis of this estimation, burst for burst in the time slots CH0–CH7.

Figure 1:
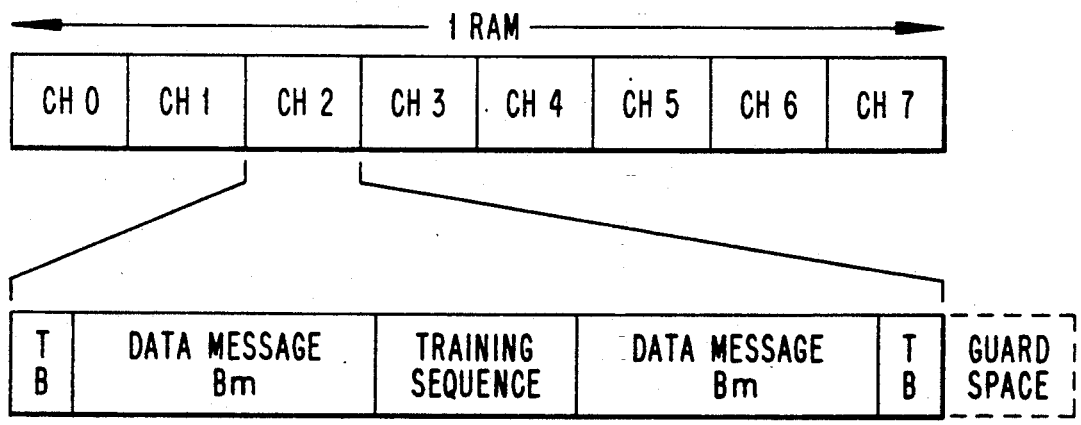
FIG. 1 illustrates a radio channel having eight time slots and illustrates schematically the content of one time slot.
Figure 2:
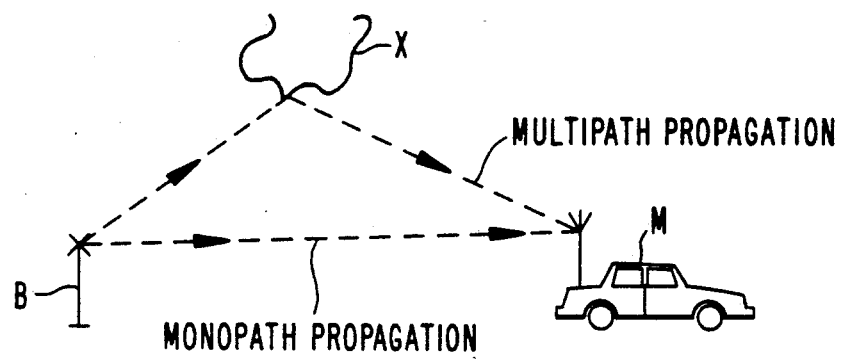
FIG. 2 illustrates monopath and multipath propagation.

FIG. 2 illustrates a base station B which functions to transmit radio waves on a given channel to a mobile M in TDMA in accordance with FIG. 1. Radio waves travelling in a given direction are reflected by a permanent or movable obstacle X, whereas other waves propagate unobstructed to the mobile M, where they are received. The multipath propagation illustrated in FIG. 2 gives rise to fading, which may take mutually different forms. When time differences between received waves are concentrated to a time interval which is much smaller than the bit time, Tbit (see FIG. 3), so-called flat fading will occur. When the time differences are greater, two or more separated waves will occur, each having more or less non-dependent fading. This fading gives rise to varying amplitude and phase upon reception. A coherent demodulator in the receiver is forced to follow this phase change by the equalizer. The phase position can be determined unambiguously, by transmitting a known sequence in the aforesaid synchronizing interval SW. When the channel does not vary too quickly, i.e. at low bit rates, it is not necessary for the demodulator to update the information which relates to the phase position of the received signal during the time of detecting the data message, whereas when the bit rate is high, it is necessary to set the propagation parameters at the beginning of each time slot, and sometimes also during the duration of the time slot.

Figure 3:
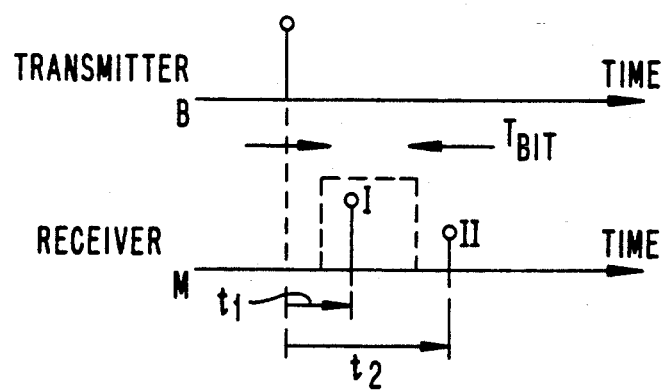
FIG. 3 illustrates time dispersion.

FIG. 3 illustrates the manner in which an impulse transmitted by the transmitter in the base station B is received in the receiver M of the mobile in dependence on the aforesaid fading. Impulse response has the form of two impulses I and II, of which I is delayed by the time $t_1$ corresponding to the propagation time, and the impulse II is attenuated and further delayed by the time $t_2$, due to reflection on X in accordance with FIG. 2. FIG. 3 solely illustrates an imaginary case for the purpose of illustrating the principle. In actual fact, so-called intersymbol interference will occur in the receiver, i.e. a combination of the pulses I and II. It has also been assumed that the impulse response will only comprise two impulses. In reality, there will be obtained an interference pattern which comprises a large number of reflected impulses. FIG. 3 illustrates, however, so-called time dispersion, i.e. in the case of multipath propagation, a transmitted impulse will give rise to a plurality of time-displaced impulses (FIG. 3 shows only two such impulses, namely the pulses I and II). The bit time $T_{bit}$ is also significant in this context. In order to enable the channel to be considered free from time dispersion, the bit time $T_{bit}$ should be of sufficiently long duration that the pulse II of significance will fall within the $T_{bit}$-interval, i.e. $t_2 - t_1 << T_{bit}$. The time dispersion may give rise to bit errors due to the aforesaid intersymbol interference. The influence of said time dispersion can be reduced, by using low data rates, i.e. $T_{bit}$ is relatively large (rates < 25kbit/s), or by using an equalizer.

Figure 4:
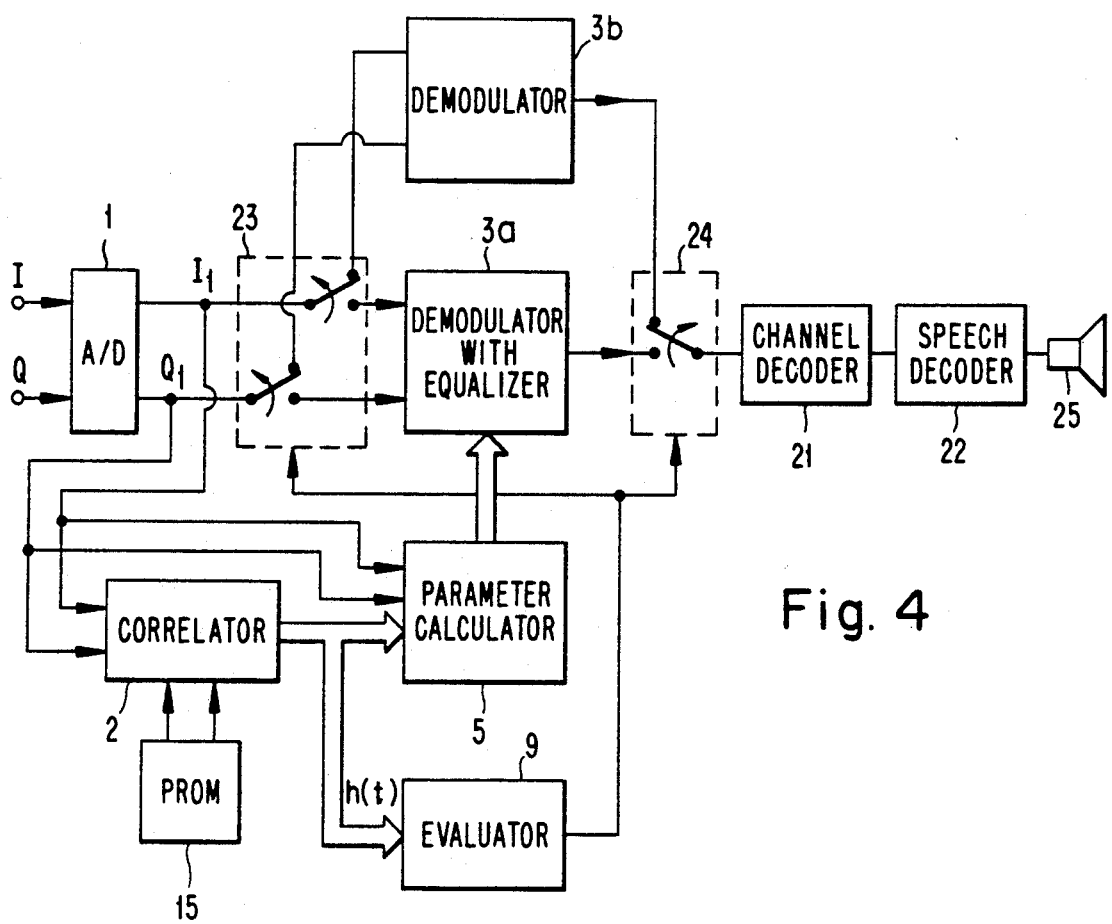
FIG. 4 illustrates schematically a mobile telephone receiver in accordance with one embodiment of the proposed method.

FIG. 4 illustrates a first embodiment of the inventive radio receiver. An analogue-digital converter 1 has connected thereto two quadrature channels I and Q having modulating signals within the baseband from a radio-frequency input circuit, not shown here. This circuit includes a local oscillator, a phase shifter (90°) and a lowpass filter. Thus, two quadrature components within the baseband are obtained over the outputs I1 and Q1 of the analogue-digital converter in sampled form (e.g. in the form of samples whose interspacing corresponds to the sampling rate). These two components are applied as one input magnitude to a correlator 2 of known design, the other input pair of which (real and complex) are connected to a memory unit 15 (PROM) which stores in complex form the synchronizing word $SW_o$ transmitted on the transmitter side. As previously mentioned, this word is transmitted within the so-called training interval. The correlator 2 thus effects correlation between the received synchronizing word SW transmitted over the radio channel and the actual synchronizing word $SW_o$ itself, the channel impulse response obtained being transmitted from the output of the correlator 2 to a parameter calculator 5. The impulse response is used for channel estimation with regard to monopath and multipath propagation and also with regard to the extent of such propagation, as explained in more detail below.

An evaluator 9 is connected to the output of the correlator 2 and functions to evaluate the obtained impulse response for the burst received in the time slot CH2 assigned to the receiver. There is obtained over the evaluator a signal which constitutes a measurement of the time dispersion of said burst. Connected to the output of the analogue-digital converter is a switching unit 23 which can be controlled from the evaluator 9. The switching unit 23 functions to activate a demodulator 3a incorporating an equalizer, while deactivating, at the same time, a demodulator 3b which lacks an equalizer or vice versa. The demodulator 3a may, for instance, be an adaptive Viterbi-equalizer having a decision circuit and decoder, of the kind described in 38th IEEE Vehicular Technology Conference 15–17 June 1988 Philadephia Pa. (p. 639), while the demodulator 3b may, for instance, be a detector for noncoherent detection, comprising a differential decoder which compiles the difference between two phase values with symbol time distance (e.g. $2T_{bit}$ according to FIG. 3 when the symbol rate is half the bit rate). A decoder of this kind is described, for instance, in 39th IEEE Vehicular Technology Conference Volume I, San Francisco, Calif. May 1–3, 1989 (page 18).

The output of each demodulator 3a, 3b is connected to a switch 24, which in turn is connected to the channel-decoder 21 of the radio receiver. Thereafter follow the speech decoder 22 and the speaker unit 25.

The evaluating unit 9 calculates the two signal values a or b, on the basis of the evaluated time dispersion value. If the time dispersion is greater than a given value, a signal a is sent to the switching units 23 and 24 which, upon receipt of said signal, connect the demodulator 3a into the receiving path of the radio receiver. When the time dispersion is longer than the prescribed value, a signal b is sent to the switching units 23 and 24, causing the demodulator 3a to be deactivated while activating the demodulator 3b at the same time.

Figure 5:
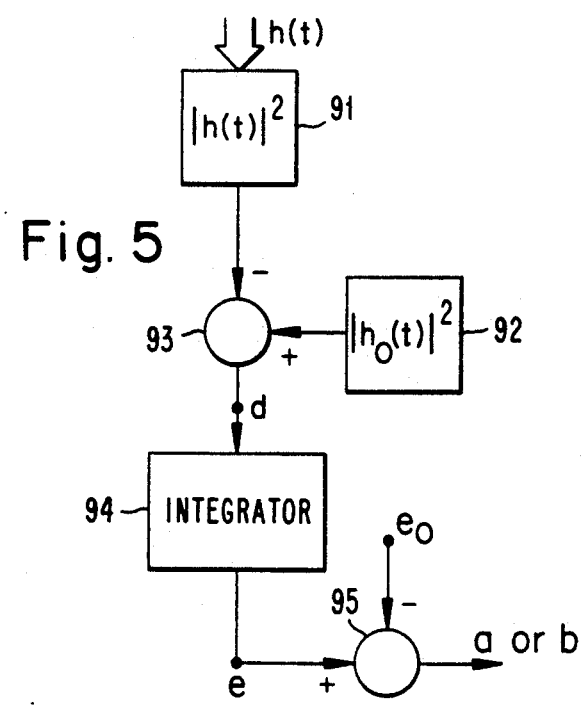
FIG. 5 is a block diagram of an evaluating unit incorporated in the receiver illustrated in FIG. 4.

FIG. 5 illustrates the construction of the evaluating unit 9 in more detail. The input magnitude h(t) constitutes the channel impulse response and is quadrated in the multiplier 91. The multiplier 91 thus compiles the magnitude $/h(t)/^2$, a measurement of the energy of the impulse response h(t). It is also conceivable to form the impulse response energy during different time intervals thereof, as described in Swedish Patent Application 8701679-6, see the diagrams presented in FIGS. 10 and 11. An ideal value (quadrated) $/h_o(t)/^2$ of the impulse response (in the absence of time dispersion) is stored in a memory 92, and is compared with $/h(t)/^2$ in a difference former 93. This results in a measurement d of the time dispersion. The difference former 93 may optionally have the form of a summator 94 coupled for integration or summation of the value of the time dispersions over several bursts. This results in a value e, which is compared with a prescribed value $e_o$ stored in the difference former 95 and which thereafter determines the signals a or b operative to control the switches 23 and 24 in the aforedescribed manner.

In the aforedescribed embodiment, the time dispersions are estimated, by measuring and evaluating impulse response energy, optionally solely during given time intervals.

Figure 6:
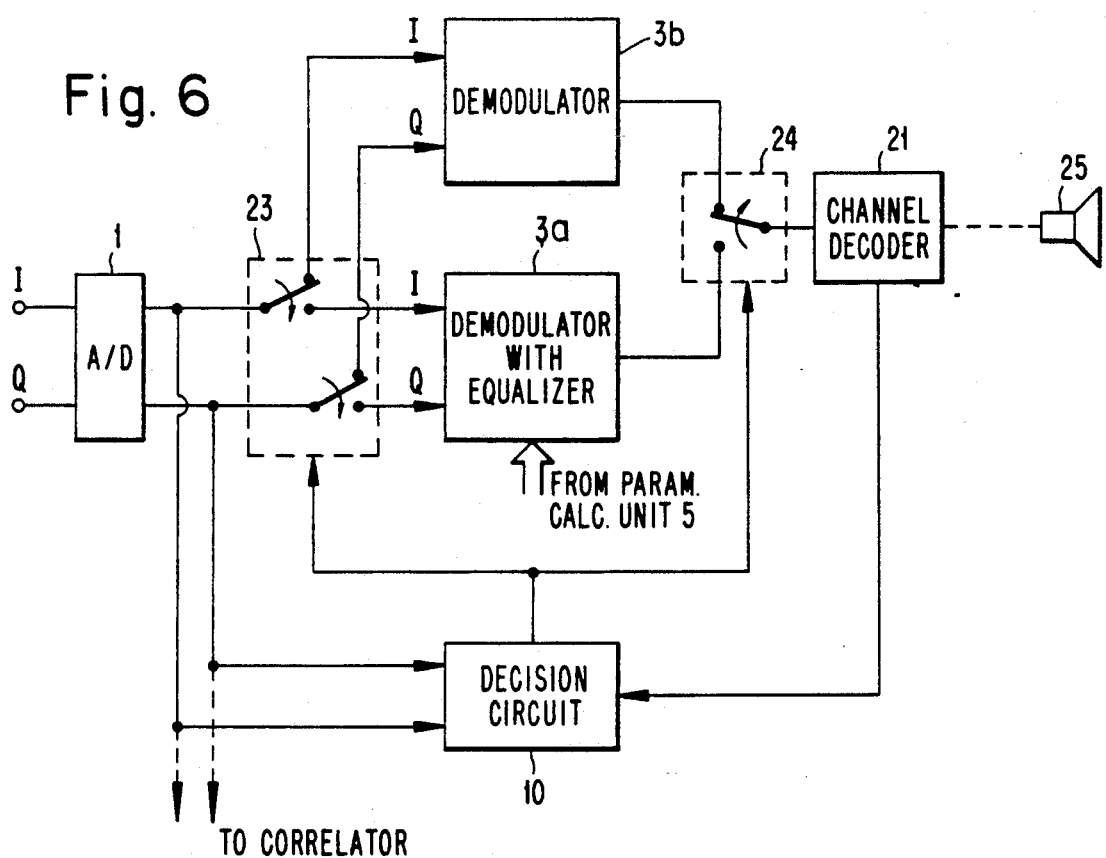
FIG. 6 illustrates schematically a mobile telephone receiver according to another embodiment of the proposed method.

Another method of evaluating time dispersion is to study the combination of the received field strength (=RSSI) and the result of bit-error measurement in the channel decoder. FIG. 6 illustrates an example of such time dispersion evaluation. Those units in FIG. 6 which have correspondence in FIG. 5 are identified by the same reference signs. The channel decoder 21 is able to evaluate the bit error content by, e.g., error detecting codes of the demodulated baseband signal and to provide information relating to this bit error content. A decision circuit 10 measures the power of the signal obtained from the analogue-digital converter 1, i.e. the power of the I and Q components of the non-modulated signal. As will be understood, the incoming signal power can be measured prior to dividing the signal into its quadrature components. This is effected primarily in order to obtain a measurement of the received field strength.

If the field strength received is very high, at the same time as the channel decoder detects a high bit error content or attempts to correct many bits, this indicates that time dispersion prevails. The decision circuit will then send a signal to the switching units 23 and 24, such as to engage the demodulator 3a (with equalizer) and disengage the demodulator 3b, if it is assumed that the demodulator 3b was engaged initially in the radio receiver. The embodiment illustrated in FIG. 6 is applied preferably only for the switching sequence demodulator without equalizer - demodulator with equalizer. This switching sequence is obviously more important than the opposite sequence, since demodulator with equalizer will function for all channel types.

Similar to the case illustrated in FIG. 4, the decision circuit 10 is able to carry out some form of mean value compilation over several burst intervals.

Figure 7:
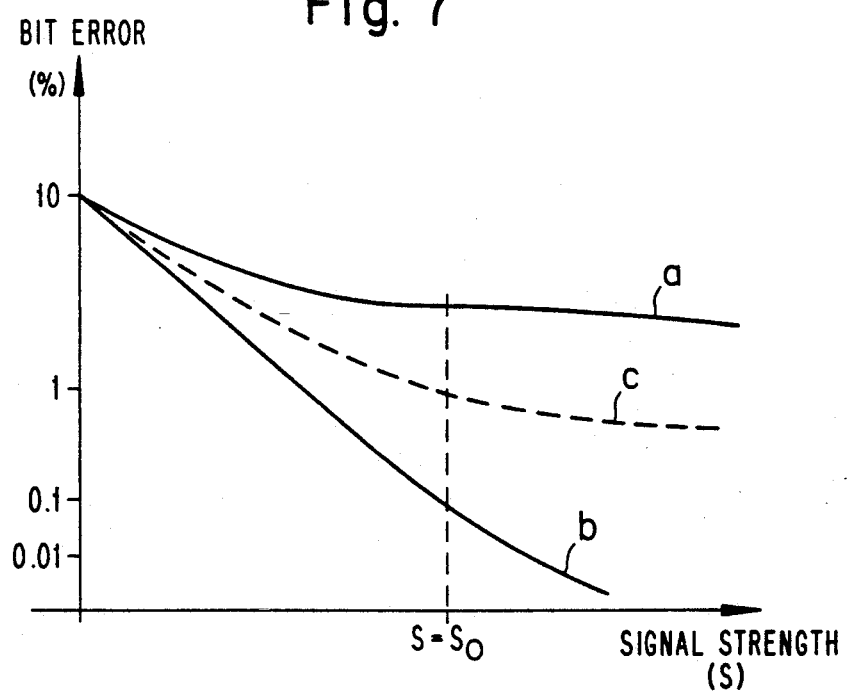
FIG. 7 is a diagram showing bit error content as a function of received signal strength.

FIG. 7 is a diagram which presents the bit error content of a received radio signal as a function of received signal strength. In general, when the signal strength increases, the bit error content will decrease, since the receiver may then be located close to a transmitter and the effect of multipath propagation and disturbances will be small.

The curve a illustrates a case where disturbing time dispersion, e.g. multipath propagation, occurs even when the signal strength is high. This case will prevail, for instance, in a densely built-up area. No demodulation with equalization will take place in the receiver in this case.

The curve b illustrates the case without time dispersion, where the bit error content approaches zero for sufficiently high signal strength, irrespective of whether equalization takes place or not.

The decision circuit 10 investigates the bit error content at a given signal strength $S_o$ in order to determine the presence of time dispersion. When the bit error content is established to be about 0.1% of this signal strength, the curve b will apply and no switching takes place. If, on the other hand, the bit error content is established to be about 3.5% in accordance with the diagram, the decision circuit considers that time dispersion is present and switching takes place to the demodulator 3a with equalizer. A tolerance value of 1% applies to the signal strength $S_o$, which forms a decision basis for the decision circuit 10.

The broken curve c determines the tolerance values at mutually different, varying signal strengths S.

The decision circuit 10 may include a time function (timer) which, after a given time interval, sends a control signal to the switching units 23 and 24 for switching the demodulator 3a with equalizer to the demodulator 3b without equalizer, for the purpose of testing whether the latter case is possible and to save further power. If the bit error content is still low subsequent to this switching procedure (curve b), the latter case can be maintained. If, however, the bit error content is again high subsequent to said switching process (curve a), it is necessary to switch from the demodulator 3b without equalizer to the demodulator 3a with equalizer (curve b).

It is not necessary for the decision circuit 10 to make an evaluation for each burst or to integrate over each burst in a plurality of mutually sequential bursts. For instance, the decision circuit can be constructed to cease measuring and evaluating after a given time interval (e.g. 10 seconds). It is often the case that the surroundings in which the radio receiver is found do not change rapidly in relation, for instance, to tens of bursts. Furthermore, the need to engage the equalizer rapidly is relatively small. In the case of densely built-up areas, however, the nature of the surroundings can change rapidly, for instance in a town or city with alternating free sight to the base station and reflectors in the vicinity (hills, mountains, buildings).

The inventive method is primarily applied when the mobile is located in its listening mode. In this position, the mobile is in operation and listens to incoming conversations over a control channel (CCH). At present, this channel is an analogue channel, but in the future may be a digital channel to which the inventive concept can also be applied. The predominant part of the use time of the mobile radio receiver is the listening time, during which listening over the control channel takes place.

In the case of an analogue control channel, there is no need for an equalizer, since the bit rate is low, normally about 10 kbit/s. When, however, the control channel (in addition to the speech channel) is digital and has a high bit rate (>10 kbit/s) a digital equalizer is required, although in this case it is important that the equalizer is not engaged when not required because of the relatively high current consumption. Switching is not so essential in the speech mode, since the current consumption is "masked" by other units operating in this latter mode.

I claim:

1. A method for reducing the power requirement of a mobile radio receiver in the listening mode of the receiver, or in the speech mode of the receiver in which incoming radio signals over a digital radio channel are demodulated and equalized with respect to the degree of time dispersion to which the radio signals are subjected during signal propagation between transmitter and receiver, comprising the steps of: estimating the time dispersion of incoming radio signals, comparing this estimated value with a prescribed value that is indicative of an amount of time dispersion above which equalization is necessary during demodulation, and switching in the receiver from demodulation of radio signals without equalization to demodulation with equalization, and vice versa, on the basis of said comparison.

2. A method according to claim 1, wherein the estimating step comprises the steps of recovering an impulse response of the radio channel, forming a value from the recovered impulse response that is representative of the energy of the impulse response, and comparing the formed value with a given value that is representative of the energy of an impulse response in the absence of time dispersion to produce the estimated value of the time dispersion.

3. A method according to claim 2, wherein the formed value is compared with the given value during a plurality of incoming bursts of said radio signals, and wherein the estimating step further comprises the step of integrating a result of said comparison over a given time interval spanning the plurality of incoming bursts to produce the estimated value of the time dispersion.

4. A method according to claim 1, wherein the estimating step comprises the steps of measuring a field strength of the radio signal, and establishing a bit error content of the demodulated radio signal for the measured field strength, and the step of switching to demodulation with equalization is carried out when the bit error content exceeds a given prescribed value.

* * * * *